United States Patent [19]
Morrison et al.

[11] Patent Number: 6,122,186
[45] Date of Patent: *Sep. 19, 2000

[54] HIGH POWER MINIATURE DEMAND POWER SUPPLY

[75] Inventors: James S. Morrison, Arcade; Joseph Niescierenko, Rochester; Kalman F. Zsamboky, Victor, all of N.Y.

[73] Assignee: Zecal Corp., Chesterfield, Mich.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/788,283

[22] Filed: Jan. 24, 1997

Related U.S. Application Data

[63] Continuation-in-part of application No. 08/642,463, May 3, 1996, Pat. No. 5,608,617.

[51] Int. Cl.$^7$ ....................................................... H02M 1/08
[52] U.S. Cl. ................................ 363/147; 363/97; 363/21
[58] Field of Search ..................................... 323/267, 282; 363/21, 43, 45, 46, 52, 54, 97, 147

[56] References Cited

U.S. PATENT DOCUMENTS

| | | | |
|---|---|---|---|
| 4,622,627 | 11/1986 | Rodriguez et al. | 363/21 |
| 4,873,757 | 10/1989 | Williams | 363/147 |
| 5,289,364 | 2/1994 | Sakurai | 323/267 |
| 5,355,301 | 10/1994 | Saito et al. | 363/97 |
| 5,384,691 | 1/1995 | Neugebauer | 363/147 |
| 5,608,617 | 3/1997 | Morrison et al. | 363/97 |

*Primary Examiner*—Jeffrey Sterrett
*Attorney, Agent, or Firm*—Howard J. Greenwald

[57] ABSTRACT

A miniature power supply and voltage regulator containing a ceramic substrate with conductive metal bonded to the top and bottom of the substrate. The power supply contains a first device for converting alternating current to direct current, a device means for converting alternating current to direct current, a device for determining the current demands of a load, and a device for delivering the current demands to the load. The said power supply and voltage regulator has a power handling capability of at least 23 watts per square inch of surface area.

14 Claims, 18 Drawing Sheets

HIGH POWER MINIATURE DEMAND POWER SUPPLY

CROSS-REFERENCE TO RELATED PATENT APPLICATION

This application is a continuation-in-part of applicants' patent application U.S. Ser. No. 08/642,463, filed on May 3, 1996 and now U.S. Pat. No. 5,608,617.

FIELD OF THE INVENTION

A miniature demand power supply and voltage regulator which can handle in excess of 1,000 watts of power.

BACKGROUND OF THE INVENTION

As electronic assemblies becomes more complex and, simultaneously, more miniaturized, there is a need for components of these assemblies which can handle a large amount of power while still retaining their small size. Thus, for example, the electronic assemblies in automotive engines are subjected to a substantial amount of heat, much of which they generate themselves; but, because of design dictates, they must be relatively small and light. There are similar needs for miniaturized components in most modern day electronic equipment.

Electronic components must dissipate a substantial amount of heat they generate; excessively high temperatures impair the operation of solid state components and often destroy them.

Heat dissipation, however, is a function of the thermal conductivity of electronic assemblies. The thermal conductivities of these assemblies varies with the nature of the materials used in them and their mass.

In many applications, power outputs in excess of 1,000 watts are required. To the best of applicants' knowledge and belief, the prior art power supplies which are capable of providing such an output must have a surface area of at least about 64 square inches and often weigh in excess of five pounds. For many required applications, these devices are too large, heavy, and cumbersome.

It is an object of this invention to provide a power supply which is substantially smaller and lighter than prior art power supplies but can handle in excess of 1,000 watts of power.

SUMMARY OF THE INVENTION

In accordance with this invention, there is provided a miniature power supply comprised of a bottom metal ground plane bonded to an intermediate ceramic substrate; the metal is preferably copper (although it could be silver, gold, or aluminum), and the ceramic is preferably alumina (although it could be beryllia, e.g.). Metalized copper circuitry is preferably bonded to the top of the alumina substrate.

BRIEF DESCRIPTION OF THE DRAWINGS

The present invention will be more fully understood by reference to the following detailed description thereof, when read in conjunction with the attached drawings, wherein like reference numerals refer to like elements, and wherein:

FIG. 15A is the power supply of the controller of FIG. 15;

FIG. 15B is the clock of the controller of FIG. 15; and

FIG. 15C is the voltage control circuitry of the controller of FIG. 15;

DESCRIPTION OF THE PREFERRED EMBODIMENTS

Figure 1:
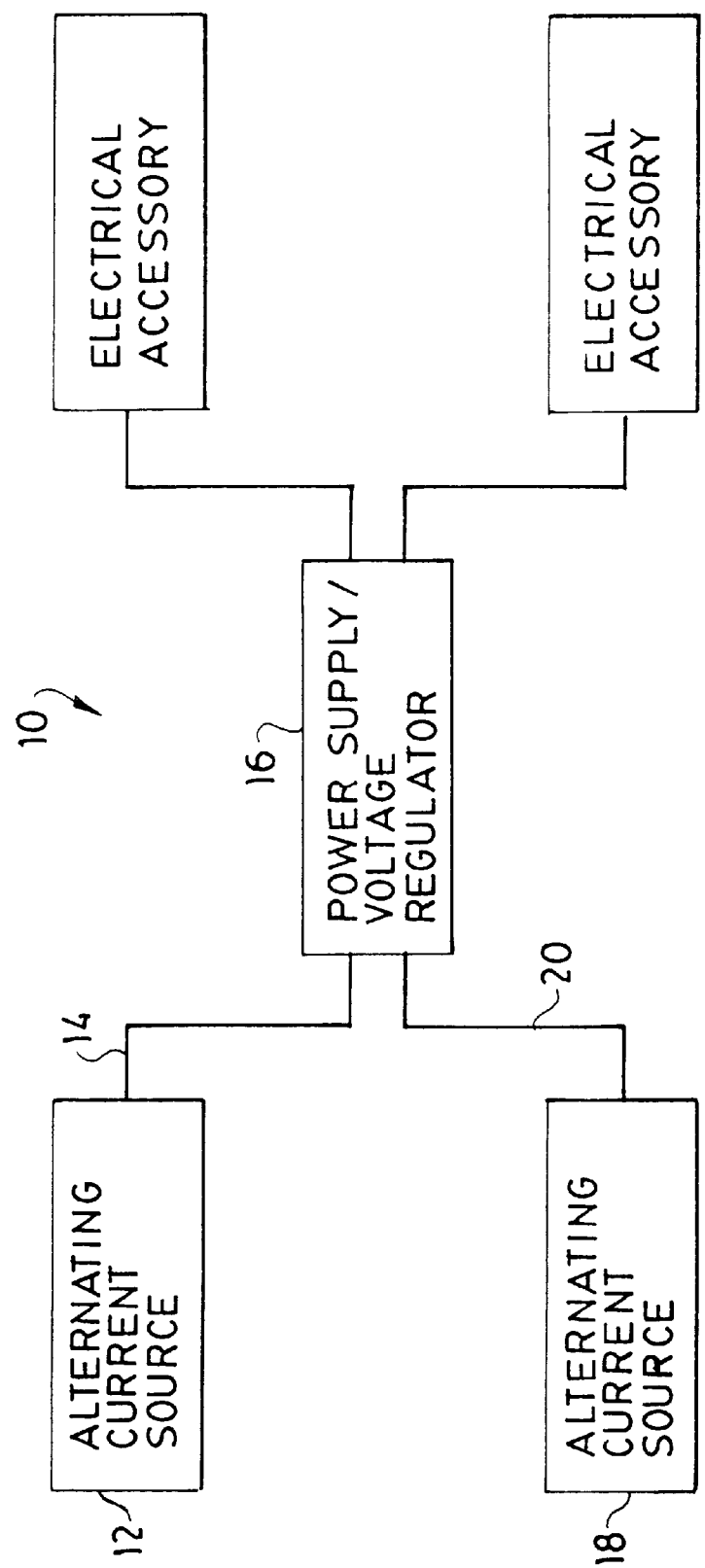
FIG. 1 is a block diagram illustrating one preferred electronic assembly using the power supply of the invention.

FIG. 1 is a block diagram illustrating one preferred electronic assembly using the power supply/voltage regulator of this invention.

Referring to FIG. 1, it will be seen that electronic assembly 10 is comprised of a first source of alternating current 12 which providing alternating current via line 14 to power supply/voltage regulator 16.

Alternating current source 12 can be any conventional device which provides alternating current. It is preferred that the alternating current provided by current source 12 provide an root mean square voltage of from about plus and minus 1 to about plus and minus 400 volts. In a more preferred embodiment, current source 12 provides from about plus and minus 1 to about plus and minus 160 r.m.s. volts of power.

In one embodiment, single-phase power is supplied by current source 12. In another embodiment, three-phase power is supplied by current source.

Devices for providing single-phase and three-phase alternating current and voltage outputs are known to those skilled in the art. Thus, by way of illustration and not limitation, power supply 12 may be one or more of the conventional power supplies described in U.S. Pat. Nos. 5,400,443, 5,436, 822, 5,434,738 (three-phase alternating current power supply), 5,365,146 (high voltage alternating current power supply), 5,361,120 (three phase a.c. power supply), 5,355, 075 (three phase a.c. power supply), 5,350,959 (alternating current generator), 5,339,255 (multi-stage power supply), 5,323,102 (alternator), 5,300,874, 5,274,208, 5,032,974 (three-phase power supply), 4,816,985, 4,807,102, 4,463, 414 (power supply for highly inductive load), 3,577,060, and the like. The disclosure of each of these United States patents is hereby incorporated by reference into this specification.

Referring again to FIG. 1, and in the preferred embodiment depicted therein, power supply 12 may be the only source of alternating current fed into power supply/voltage regulator 16. Alternatively, or additionally, one may feed a separate alternating current into regulator 16 from power supply 18.

In one embodiment, power supply 12 is an alternator whose output ranges from about 1 ampere to about 50 amperes and whose rms voltage varies from plus and minus 1 volt to plus and minus 200 volts. In this embodiment, power supply 18 is preferably identical to power supply 16; and its output is transmitted via line 20 to power supply/voltage regulator 16. In another embodiment, not shown, power supplies 16 and 18 produce different outputs; in one aspect of this latter embodiment, power supply produces 25 amperes, and power supply 18 produces 50 amperes.

As will be apparent to those skilled in the art, although two alternating current power supplies are illustrated in FIG. 1, only one such power can be used, or three such power supplies can be used, or four or more such power supplies can be used, etc.

Power supply/voltage regulator 16 will convert one or more of the incoming alternating current inputs (such as the inputs from lines 14 and 20) to one or more direct current outputs at a defined and regulated voltage.

The process of this invention can be used to make many of the power supply/voltage regulators of the prior art substantially smaller yet still capable of producing power outputs in excess of 1,200 watts. Thus, by way of illustration, one of the power assemblies of this invention has an output about 1224 watts.

Thus, by way of illustration, one may use the blocking-oscillator switched mode power supply disclosed in U.S. Pat. No. 5,420,776; the entire disclosure of this patent is hereby incorporated by reference into this specification. This power supply is comprised of a transformer having a primary winding. A smoothing capacitor is connected to the primary winding. A bridge rectifier is connected to the smoothing capacitor. A semiconductor switching element is connected to the primary winding for the clocked application of the alternating voltage, being rectified by the bridge rectifier and smoothed by the smoothing capacitor, to the primary winding.

By way of further illustration, one may use the power supply disclosed in U.S. Pat. No. 5,398,182, the entire disclosure of which is also incorporated by reference into this specification. With this power supply, the rectified output of two or more secondaries are connected in series and then parallel, each half-cycle of an alternating current energization signal. Logic circuitry monitors the rectified output and automatically switches from a series to a parallel connection to provide a regulated power supply output.

By way of yet further illustration, one may use the power supply control system disclosed in U.S. Pat. No. 5,383,140, the entire disclosure of which is hereby incorporated by reference into this specification. This power supply control system is usable with portable computer having a central processing unit and is operable in response to a power supply from a rechargeable battery or alternating current. The control system includes a charge unit for charging, current demand detection, and a power control microprocessor for controlling the charge independently of the central processing unit.

Thus, by way of further illustration, one may use the alternating, current-fed power supply disclosed in U.S. Pat. No. 4,084,217. The disclosure of this patent is also incorporated by reference into this specification.

Referring again to FIG. 1, the power supply/voltage regulator preferably is comprised of certain elements. As will be more readily apparent later in this specification, it contains a first means for converting alternating current to direct current, a second means for converting alternating current to direct current, a means for determining the current demands of a load, and means for delivery such current demands to said load.

Figure 2:
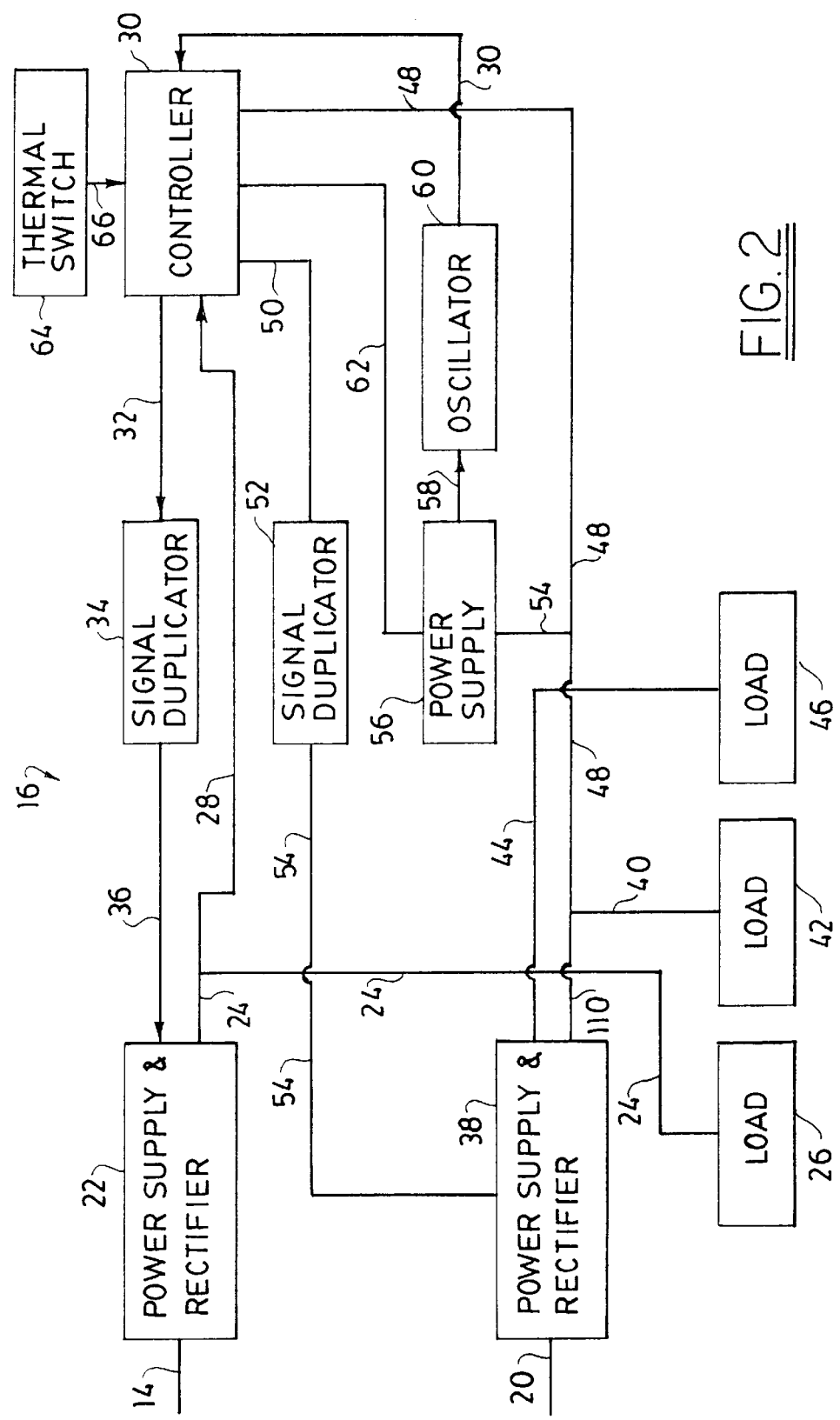
FIG. 2 is a block diagram of one preferred power supply of this invention.

FIG. 2 is a block diagram of one preferred embodiment of the power supply/voltage regulator 16. Referring to FIG. 2, three-phase alternating current from line 14 is fed to power supply/rectifier 22, which converts such alternating current into one defined direct current output 24; in one embodiment, current output 24 is 28 volts of direct current. Current output 24 is preferably fed to load 26.

In one embodiment, load 26 is comprised of a multiplicity of fuel injector assemblies which control the amount of fuel being fed to an internal combustion engine; thus, e.g., the load 26 may comprise four, six, eight, or more such fuel injector assemblies. It is preferred that the fuel injector assemblies be electric or electronic fuel injector assemblies, such as those disclosed in U.S. Pat. Nos. 5,427,319 (solenoid operated fuel injector), 5,390,493, 5,351,893 (electromagnetic fuel injector), 5,322,497, 5,201,299, 5,16, 510, 5,147,464, and the like. The disclosure of each these United States patents is hereby incorporated by reference into this specification.

Referring again to FIG. 2, line 28 is a sense line which supplies information to controller 30. Information from controller 30 is passed via line 32 to signal duplicator 34, which creates three separate control signals from the one signal fed into it via line 32 and thereafter passes these three separate pulsing gate control signals via line 36 back to power supply/rectifier 22.

Referring again to FIG. 2, alternating current is supplied via line 20 to power supply/rectifier 38, which provides substantially the same function as power supply/rectifier 22. The output 40 from power supply/rectifier 38 is supplied to one or more loads 42. Where more than one load is used, the output feeds such loads in parallel.

Thus, by way of illustration, load(s) 42 may be the lights of an automobile, and/or its radio, one or more pumps, a television, motor devices, musical instruments, and the like.

In one preferred embodiment, illustrated in FIG. 2, a separate output 42 is provided from power supply/rectifier 38 to feed one or more loads 46.

A sense line 48 from power supply/rectifier 38 is used to feed information to controller 30 which, in turn, feeds information via line 50 to signal duplicator 52, which performs substantially the same function as signal duplicator 34. The three outputs from signal duplicator 52 are then fed via line 54 back to control power supply/rectifier 38.

Power from line 48 is also fed via line 54 to control board power supply 56, which converts the voltage to a logic level voltage and then feeds it via line 58 to an oscillator 60. The output from oscillator 60 is then fed via line 62 to controller 30. Power supply 56 also supplies power to controller 30 via line 62.

Referring again to FIG. 2, a thermal switch 64 senses when the temperature of assembly power supply/voltage regulator 16 exceeds a specified temperature and, when this situation arises, it disconnects power to signal duplicator 34.

Figure 3:
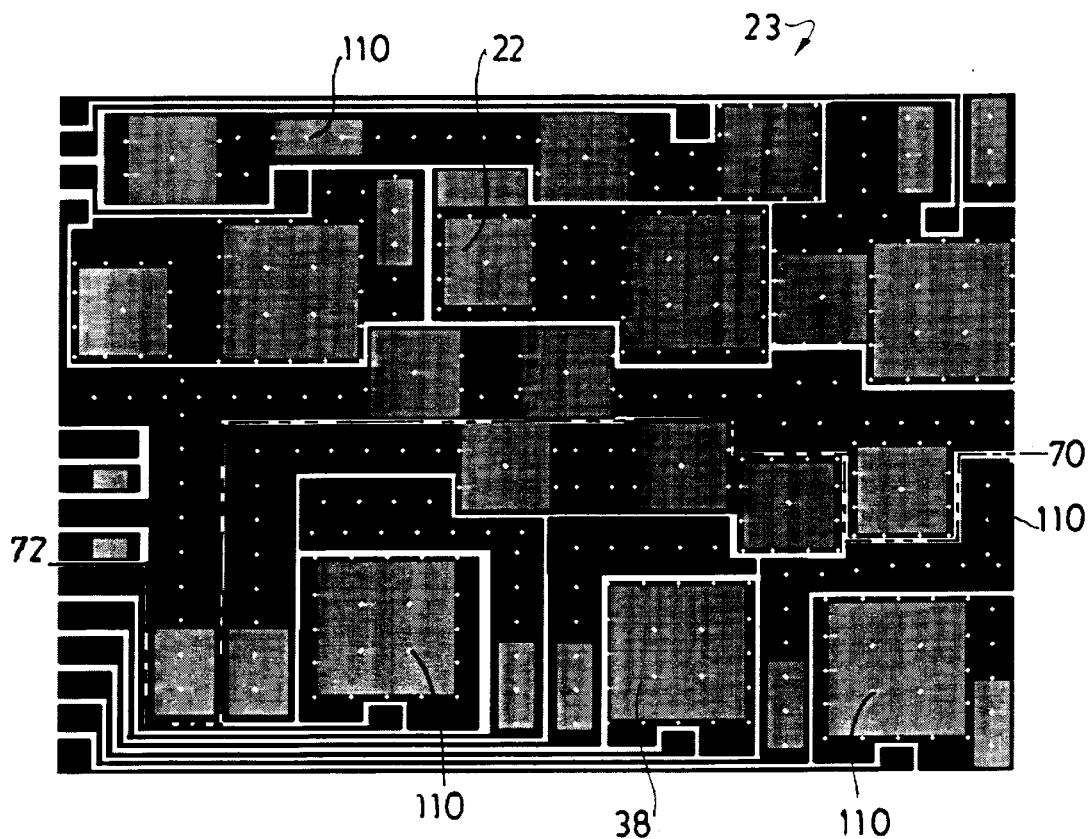
FIG. 3 is a top view of a preferred power board of this invention.

FIG. 3 is a top view of circuit board 23 and a circuit illustrating preferred embodiments of power supply/rectifiers/regulator 22 and 38. Referring to FIG. 3, the power supply/rectifier on top of lines 70 and 72 (which separates the two power supplies/rectifier circuits) is power supply/rectifier 22; and the power supply rectifier below lines 70 and 72 is power supply/rectifier 38. As will be apparent to those skilled in the art, the components used in the power supply/rectifiers 22 and 38 (such as, e.g., diodes, transistors, field effect transistors, and silicon controlled rectifiers) are "dies" (pieces of silicon chips) which are surface mounted on the circuit board.

Figure 4:
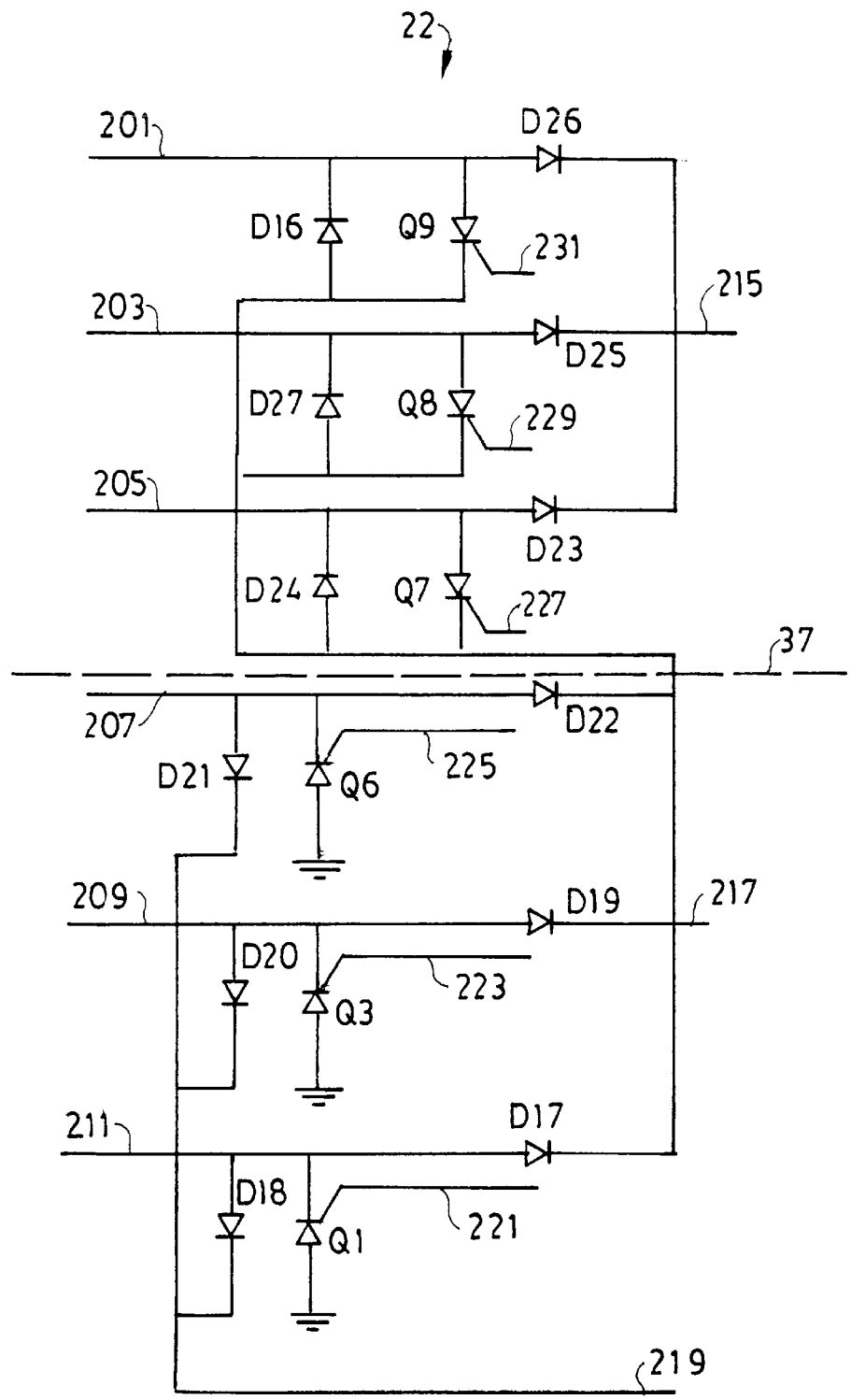
FIG. 4 is a schematic diagram of the preferred power board of FIG. 3.

FIG. 4 is a schematic of a preferred power supply/rectifier which can be used as power supply/rectifier 22 and/or supplier rectifier 38; dotted line 37 divides the two power supply/rectifier assemblies.

Referring to FIG. 4, and in the preferred embodiment depicted therein, alternating current is input via lines 201, 203, 205, 207, 209, and 211; direct current output is fed via lines 215, 217, and 219.

As will be apparent to those skilled in the art, the preferred embodiments depicted in FIG. 4 are comprised of a multiplicity of diodes (such as D18, D20, D21, etc.), silicon controlled rectifiers (such as, e.g., Q1, Q3, Q6, etc.), and gate control lines 221, 223, 225, 227, 229, and 231.

Figures 5, 5A:
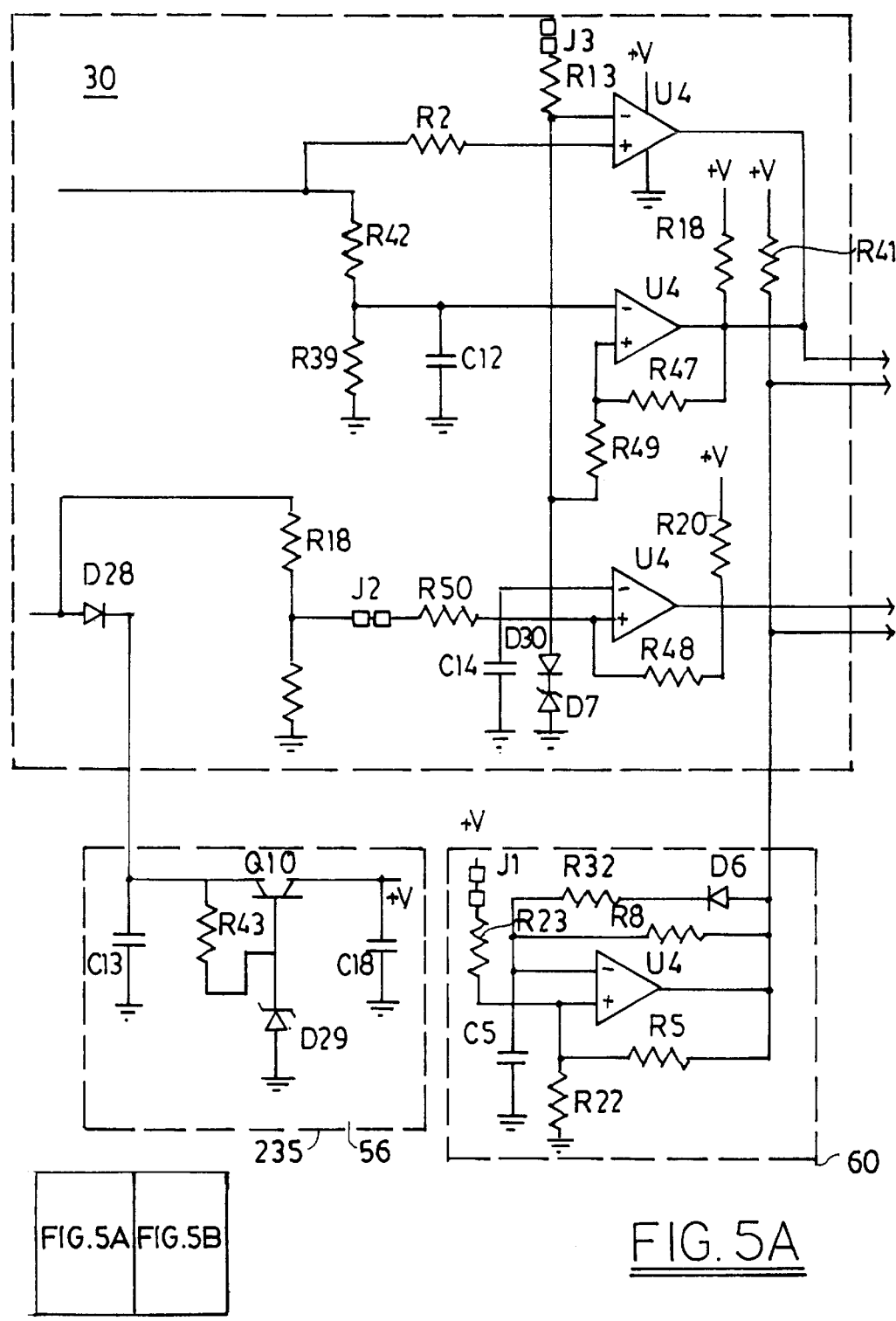
FIGS. 5, 5A, and 5B are is a schematic diagrams of a preferred controller of the power supply of FIG. 2.
Figure 5B:
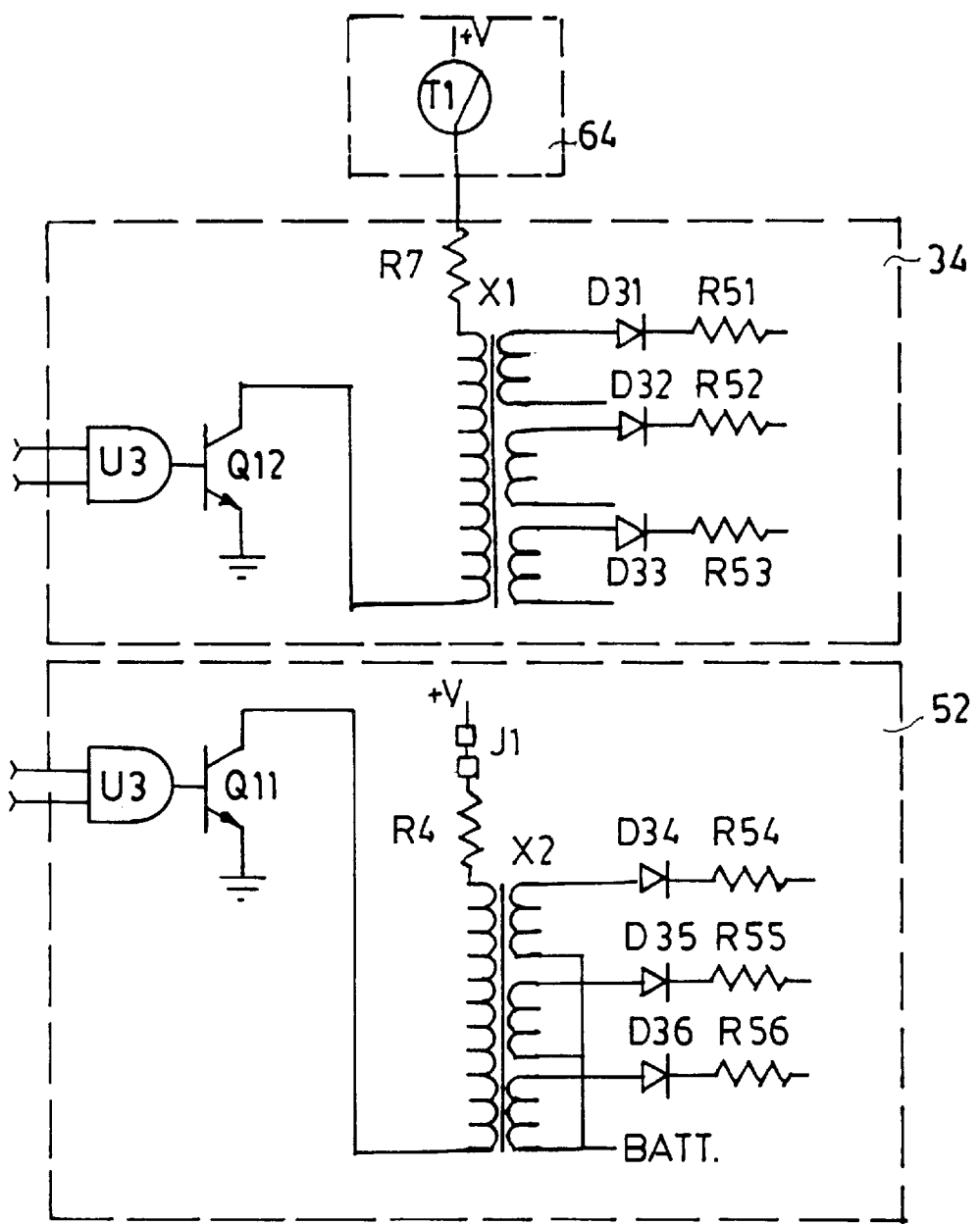

FIG. 5 is a schematic of the preferred control section 233, which includes controller 30, thermal switch 64, signal duplicators 34 and 52, oscillator 60, and power supply 56. Referring to FIG. 5, dotted lines enclose various portions of control section 233 to indicate whether such portions comprise such controller 30, thermal switch 64, signal duplicators 34 and 52, oscillator 60, and power supply 56. Resistors R39 and R40 preferably have minimum resistances of 150,000 ohms and 50,000 ohms, respectively, and are actively trimmed to the required circuit values.

Figure 6:
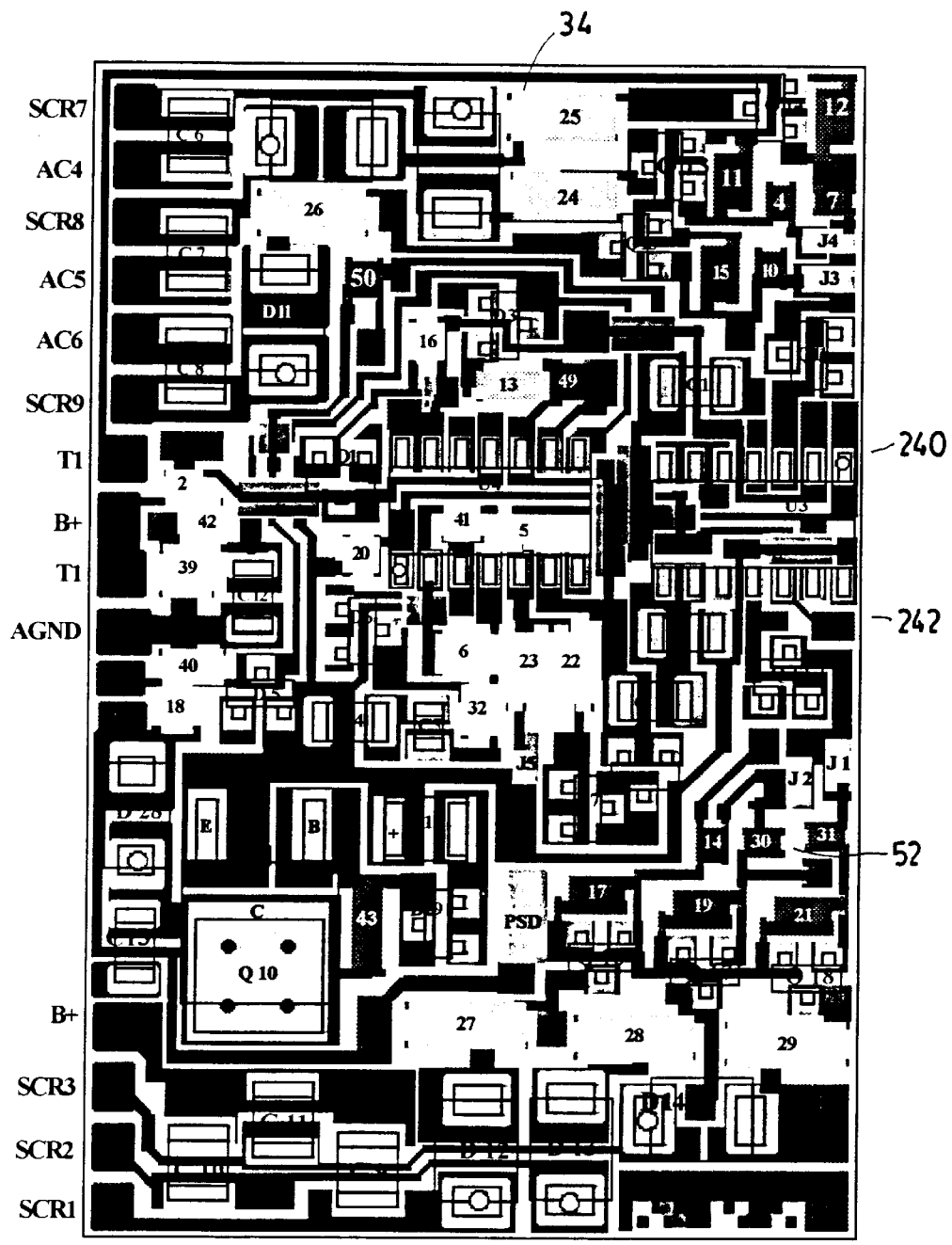
FIG. 6 is a top view of a preferred controller board of this invention.

FIG. 6 is a top view a preferred circuit board comprised of controller 30, thermal switch 64, signal duplicators 34 and 52, oscillator 60, and power supply 54, illustrating the circuit line architecture for this embodiment. Referring to FIG. 6, the term "SCR" refers to silicon controlled rectifiers, the term "AC" refers to an alternating current input, the term "T1" refers to one side of the thermal switch 64 input, the term "B+" refers to a battery input, the term "AGND" refers to a ground, the term "D" refers to a diode, the various resistive elements are referred by numbers such as, e.g., "51", "52", etc, the term "Q" refers to a transistor with emitter ("E"), base ("B"), and collector ("C"), the term "X" refers to a signal duplicator toroid, and the term "J" refers to a jumper, and the therm "C" followed by a number refers to a specific capacitor. The battery 240 and 242 is provided signal duplicators 34 and 52.

It will be apparent to those skilled in the art that many other circuit arrangements may be used to provide functions similar to those provided by the assembly of FIG. 2.

A Preferred Power Board

Figure 7:
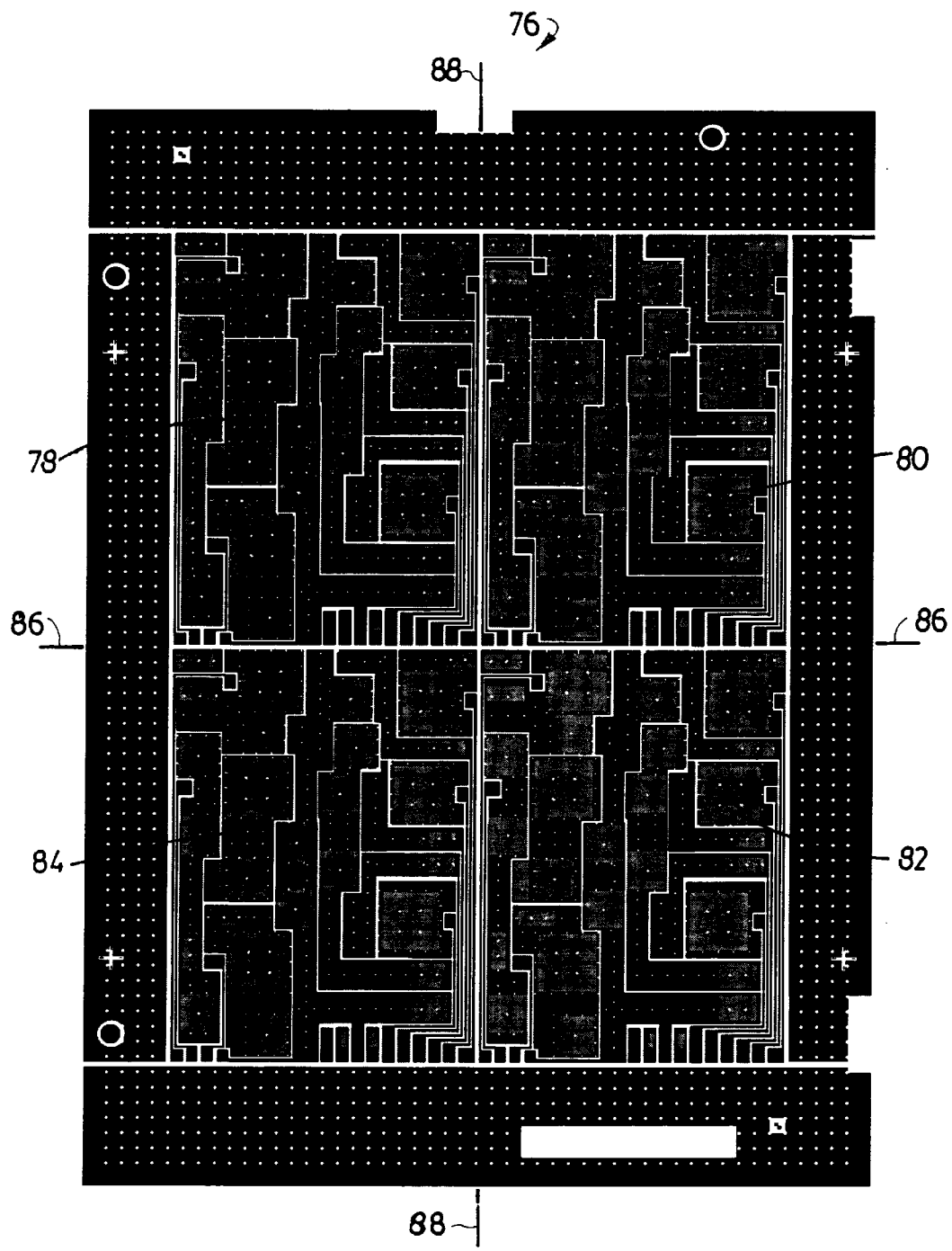
FIG. 7 is a top view of a preferred panel containing four power boards of this invention.

FIG. 7 is a top view of a substrate panel 76 which is comprised of sections 78, 80, 82, and 84 which can be separated along scribe lines 86 and 88. In the preferred embodiment illustrated in FIG. 7, each of sections 78, 80, 82, and 84 are preferably about 2 inches by 2.75 inches.

The substrate panel 76 is preferably made from a 96 percent alumina substrate in substantial accordance with the procedure described in U.S. Pat. Nos. 5,058,799 and 5,100,714; the disclosure of each of these United States patents is hereby incorporated by reference into this specification.

As will be apparent to those skilled in the art, instead of alumina one may use other substrates such as, e.g., those comprised of beryllium oxide, or of diamond, aluminum nitride, silica containing materials (such as glass), and other ceramic materials conventionally used as substrates in the printed circuit board industry.

Thus, by way of illustration, and in substantial accordance with the procedure of U.S. Pat. No. 5,058,799, a metalized substrate may be produced from a 5.0 by 7.0 inch alumina blank which is 0.025 inches thick and contains patterned copper on each of its top and bottom surfaces which is 0.0065 inches thick. The copper circuit pattern used on the top surface of the substrate is illustrated in FIG. 3.

The metalized substrate may be heat treated in a conventional furnace such as, e.g., a conveyor furnace, model number 14CF-154S, which is manufactured by the Watkins-Johnson company of Scotts Valley, Calif.

In the first stage of the heat treatment, the metalized substrate is heated to a temperature of 635 degrees Fahrenheit for 3 hours in air to form a thin layer of copper oxide on the surface of the copper. An oxide layer of from about 5 to 50 microinches is formed on the copper.

Thereafter, the oxidized substrate is conveyed through a conventional furnace, such as the aforementioned conveyor furnace, while being contacted with nitrogen flowing at a rate of from about 5 to about 150 cubic feet per minute; during this stage, from about 5 to about 80 parts per million of oxygen are present in the furnace environment. In one preferred embodiment, from about 10 to about 20 parts per million of oxygen are present in the atmosphere.

In the first stage of the furnace heating, the temperature is raised from ambient to a temperature of from about 1065 to about 1075 degrees Centigrade over a period of 45 minutes. As will be apparent to those skilled in the art, a eutectic melt is formed when the substrate is subjected to temperatures within this range. The temperature may be even higher (such as, e.g., higher than 1084, the melting point of copper); in this case, the substrate is exposed to the eutectic range of temperatures (1065 to 1075) during the ramp up to and the ramp down from the highest temperature used in the process. Reference may be had to U.S. Pat. No. 5,058,799, the entire disclosure of which is hereby incorporated by reference into this specification.

Thereafter, the substrate is preferably maintained at the soak temperature (1065–1075 degrees Centigrade, or above) for from about 5 to about 25 minutes. In one preferred embodiment, the soak time used is from about 5 to about 15 minutes.

Thereafter, the substrate is preferably cooled to ambient over a period of from about 5 to about 30 minutes and, more preferably, from about 10 to about 20 minutes.

The cooled substrate is then preferably dipped into a solution of "Posiclean A", an acid, organic, water-soluble cleaner sold by the RBP Chemical Corporation of 150 south 118th Street, Milwaukee, Wis. This material is strongly acidic (with a pH of 0.7), and it removes the copper oxide layer from the surface of the board.

Figure 8A:
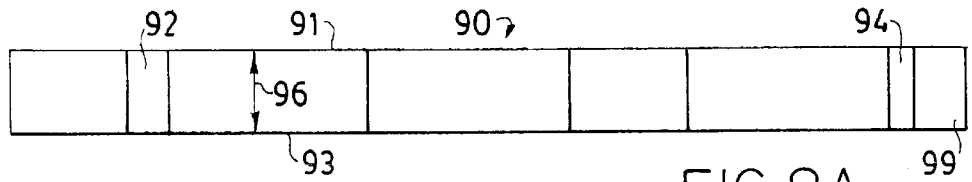
FIGS. 8A through 8D are sectional views of a substrate as it goes through various stages of the preferred process used to make a preferred power board.

FIG. 8A is a sectional view of a ceramic substrate 90 preferably comprised of alumina 99 which is comprised of through holes 92 and 94. It is preferred that through holes 92 and 94 be substantially circular in cross-section and have a diameter of from about 2 to about 50 mils; it is preferred that the diameter of the vias be from about 10 mils to about 20 mils. In one embodiment, the diameter of the through holes is from about 8 to about 17 mils and, more preferably, from about 14 to about 16 mils. In one preferred embodiment, the diameter of the via holes is from about 9 to about 12 mils.

For simplicity of representation, only two through holes 92 and 94 have been illustrated in FIG. 8A. It is preferred, however, for each 2"×2.75" section of substrate, that there be at least about 11 such through holes and, more preferably, be at least about 47 such through holes.

In one preferred embodiment, the substrate 90 is heated to a temperature high enough to produce incipient fusion on the walls of the via holes. Thus, the alumina substrate may be heated to a temperature of from about 1,200 degrees Centigrade to about 1,550 degrees Centigrade (and preferably from about 1400 degrees Centigrade to about 1450 degrees Centigrade) over a period of from about 4 to about 40 hours, held at this incipient fusion level for from about 1 to about 3 hours, and then permitted to cool to ambient temperature over a period of from about 4 to about 40 hours. Although applicants do not wish to be bound to any particular theory, they believe that this heat-treatment of the substrate thermally etches it and causes glassy components of the alumina substrate to be removed from it, thereby roughening the surface of the alumina substrate. This thermal etching process may be used in addition to, or instead of, the phosphoric acid etching process disclosed in U.S. Pat. No. 5,058,799.

Referring again to FIG. 8A, the thickness 96 of substrate rate 90 is preferably from about 10 mils to about 0.5 inches or more. It is preferred, however, that thickness 96 be from about 20 mils to about 30 and, more preferably, be from about 24 mils to about 26 mils.

Figure 8B:
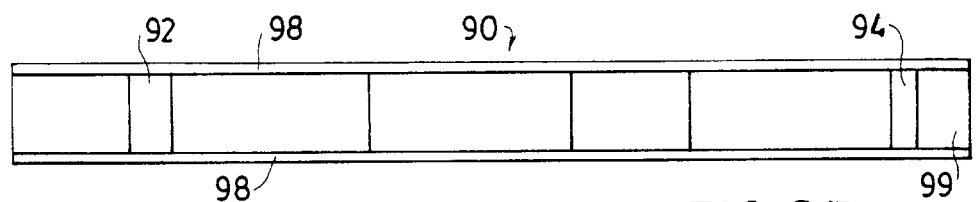

FIG. 8B illustrates ceramic substrate 8A after a layer 98 of electroless copper has been deposited on the substrate by conventional means. Thus, for example, the copper may be electrolessly deposited by the means disclosed in U.S. Pat. No. 5,058,799. It is preferred that the layer 98 of electroless copper be from about 40 to about 50 microinches thick.

After the electroless deposition of copper, a photomask (not shown) is put onto the electroless copper layer 98 by conventional means. Thereafter, referring to FIG. 8C, a layer 100 of electrolytic copper is selectively electroplated onto the exposed portions 98 of the electroless copper.

The layer 100 of electrolytic copper consists essentially of copper and has a thickness of at least about 3.5 mils. It is preferred that layer 100 have a thickness of from about 4 to about 20 miles and, more preferably, from about 5 to about 7 mils.

It is preferred that the conductive metal deposited onto the ceramic substrate have a thickness which is at least about 0.3 times as great as the thickness of the ceramic substrate.

Figure 8C:
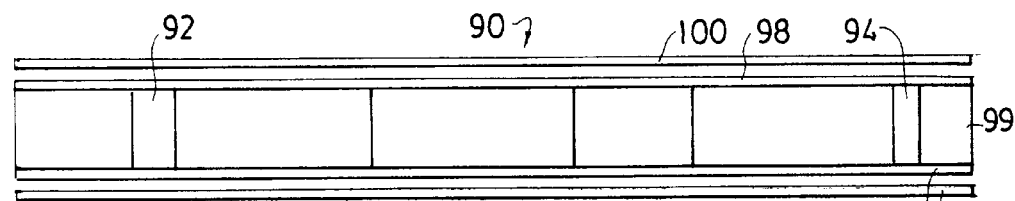
Figure 8D:
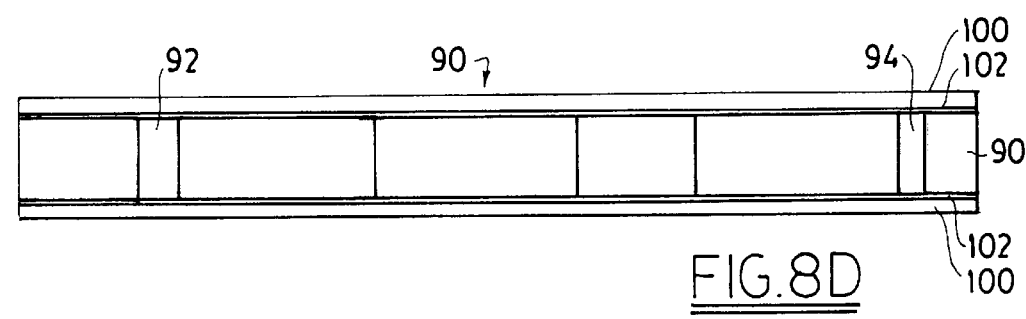

FIG. 8D illustrates the substrate 90 after it has been fired at a temperature higher than the eutectic temperature of copper and oxygen but below the melting point of copper. In general, the temperature of such firing is from about 1065 to about 1075 degrees Centigrade; see, e.g., U.S. Pat. No. 5,058,799.

It is believed that this firing causes diffusion of a eutectic melt and the production of heterogeneous juncture bond 102 between the ceramic 99 and the copper. As is indicated in U.S. Pat. No. 5,100,714, said heterogeneous juncture bond 102 has a metal-wetted surface area that is at least about twice the apparent surface area of the metal layer overlying the juncture bond and consists essentially of ceramic grains unitary with the workpiece and conductive metal unitary with the conductive metal layer, and being constituted by finger-like metal protuberances unitary with the metal layer and occupying the space between the ceramic grains.

Because of the unique combination of processing steps used to make substrate 90, this metal-ceramic composite is capable of withstanding repeated firing cycles at a temperature in excess of 850 degrees Centigrade without separation of the copper layer from the working surface of the alumina workpiece.

Referring again to FIGS. 8A, 8B, 8C, and 8D, the vias 92 and 94 are preferably completely filled. Thus, at a magnification of 200 times (and, preferably, at a magnification of 1000 times), there are no visible voids.

In one embodiment, in order to improve the hermeticity of the substrate, the metalized substrate of FIG. 8C is lapped and ground to leave the via holes 92 and 94 flush with the major surfaces of the 91 and 93 of the alumina substrate (see FIG. 8A). Thereafter, the lapped surfaces are again subjected to electroless deposition (see FIG. 8B), electrolytic deposition (see FIG. 8C), and heating to facilitate eutectic bonding (see FIG. 8D).

Figure 9:
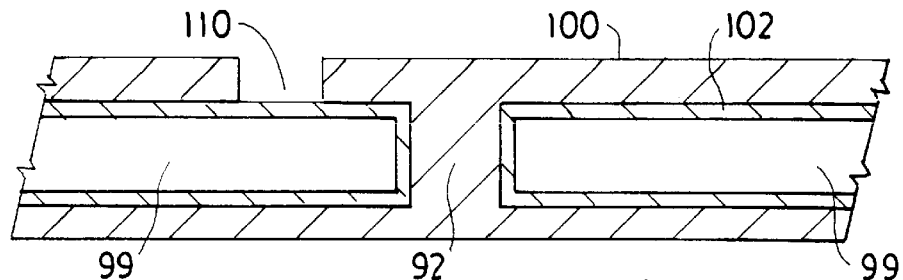
FIG. 9 is a sectional view of a preferred metallized substrate illustrating filled via and empty vent hole structures.

In one embodiment, illustrated in FIG. 9, the electrolytic deposition of copper (see FIG. 8C) creates a series of vent holes extending from the top of the electrolytic copper layer 100 to the bottom of substrate surface 99. As will be apparent to those skilled in the art, the electrolytic deposition pattern is determined by the photomask used. Alternatively, one can create such vent holes by other conventional means such as, e.g., laser drilling, manual drilling, etc.

The vent holes are generally from about 5 mils to about 25 mils in diameter. In one embodiment, they range from about 18 to about 22 mils in diameter. The vent holes may all have the same diameters, or different sizes and/or concentrations of vent holes may be used on different portions of the board.

It is preferred to have at least about 100 vent holes per square inch of metalized substrate. Thus, some typical vent hole arrangements are illustrated in FIG. 3; see vent holes 110.

FIG. 9 is a partial sectional view of substrate 90 with showing vent hole 110 and filled via 92.

Figure 10:
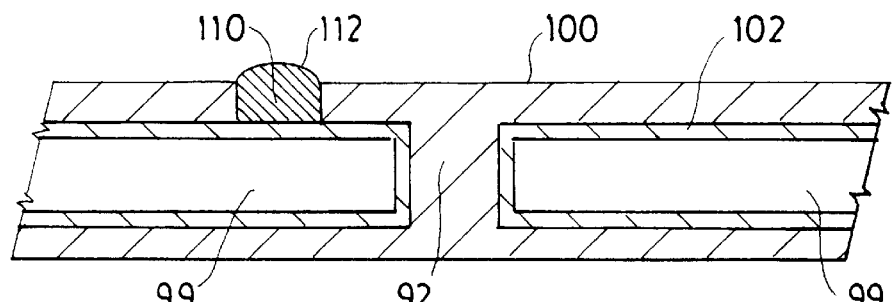
FIG. 10 is a sectional view of a preferred metallized substrate illustrating filled via and filled vent hole structures.
Figure 11:
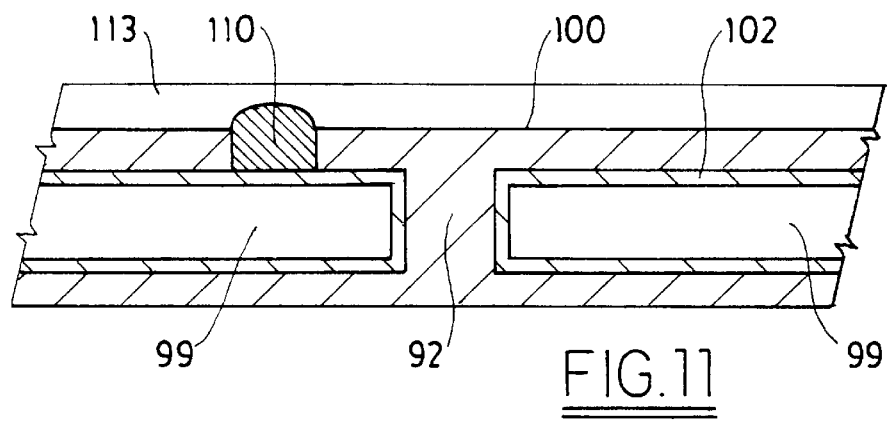
FIG. 11 is a sectional view of a preferred metallized substrate covered by a dielectric coating.
Figure 12:
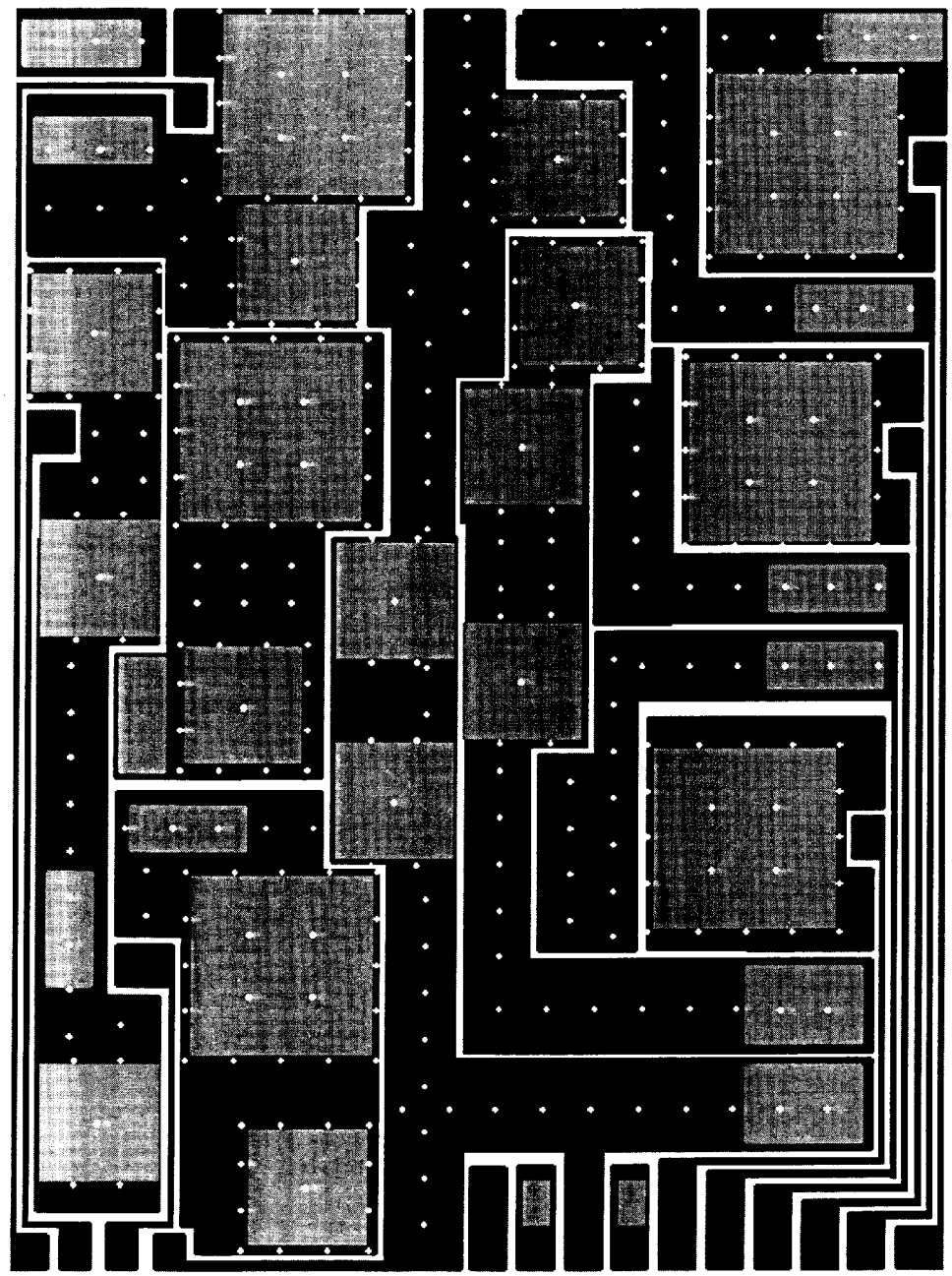
FIG. 12 is a top view of an individual power board made in accordance with this invention.

In one embodiment, illustrated in FIG. 10, the metalized substrate of FIG. 9 is printed with a copper paste/ink such as, e.g., DuPont's QP153 conductor paste. This paste, and similar pastes, generally contain at least about 80 weight percent of particulate copper grains in solvents and binders.

The printed metalized substrate is then fired in inert gas (such as nitrogen) containing from about 5 to about 25 parts per million of oxygen (and preferably from about 5 to about 10 parts per million of oxygen) at a temperature of from about 800 to about 970 degrees Centigrade; in one embodiment, a temperature of from about 895 to about 905 degrees Centigrade is used. This firing is done in order to burn out the organic material and to fuse the copper to the electrolytic copper layer 100; see FIG. 10. The copper paste 112 fills the vent hole 110.

In the next step of the process, a screen-printed layer of glass paste is selectively deposited over the top surface of the substrate, especially where circuits have to be protected. Thereafter, this screen printed substrate is heated in a furnace under nitrogen atmosphere at a temperature sufficient to melt the glass onto the copper, thereby creating a layer 113 of glass which is generally from about 1 to about 7 mils thick. One may use DuPont's 5681 glass ("dielectric) composition for this purpose, which may be fired at a temperature of from about 900 to about 990 degrees Centigrade.

In one embodiment, the dielectric shown has a coefficient of thermal expansion which substantially matches the coefficient of thermal expansion of the metallized copper. As is known to those skilled in the art, a desired coefficient of thermal expansion of a dielectric material can be engineered to certain predetermined values by utilizing components which have different coefficients of thermal expansion. Thus, as is disclosed in U.S. Pat. No. 5,224,017 (the disclosure of which is hereby incorporated by reference into this specification), a heat conductive member can be comprised of a first material having a positive coefficient of thermal expansion and a second material having a negative coefficient of thermal expansion. The first and second materials can be combined in a quantity ratio to produce a composite heat transfer device with a coefficient of thermal expansion which can be closely tailored to match the predetermined coefficient of thermal expansion of the object with which heat is to be transferred.

In the next step of the process, not shown, the electronic parts for the power board are mounted thereon by conventional surface mounting techniques such as, e.g., reflow methods. See, for example, U.S. Pat. Nos. 5,378,656, 5,347,162, 5,150,197, and the like; the entire disclosure of each of these patents is hereby incorporated by reference into this specification.

The power board produced by the process of this invention has an unexpectedly advantageous combination of property.

The thermal conductivity of the board is measured based upon the square inches of surface area. Thus, a board which has dimensions of 7"×5"×25 mils will have its thermal conductivity measured as a function of the 35 inches of surface area it has.

In general, the board preferably has a power handling capability of at least about 23 watts per square inch of surface area. That is, the total power output of the board (device forward voltage×device current, for each die summed) divided by the surface area is at least 23 watts per square inch.

The power board also has a resistivity, as measured across of the top surface of the board, of less than 0.0017 ohms. As is known to those skilled in the art, this value is close to the resistivity of copper.

The power board also preferably has a current carrying capacity of at least from about 1900 to about 2000 amperes per 900 watts, as determined by the voltage divided by the resistance of the copper trace.

Another Preferred Embodiment of the Invention

FIGS. 13–19 illustrate another preferred embodiment of the invention which is more efficient than the embodiment depicted in FIGS. 1–12.

Figure 13:
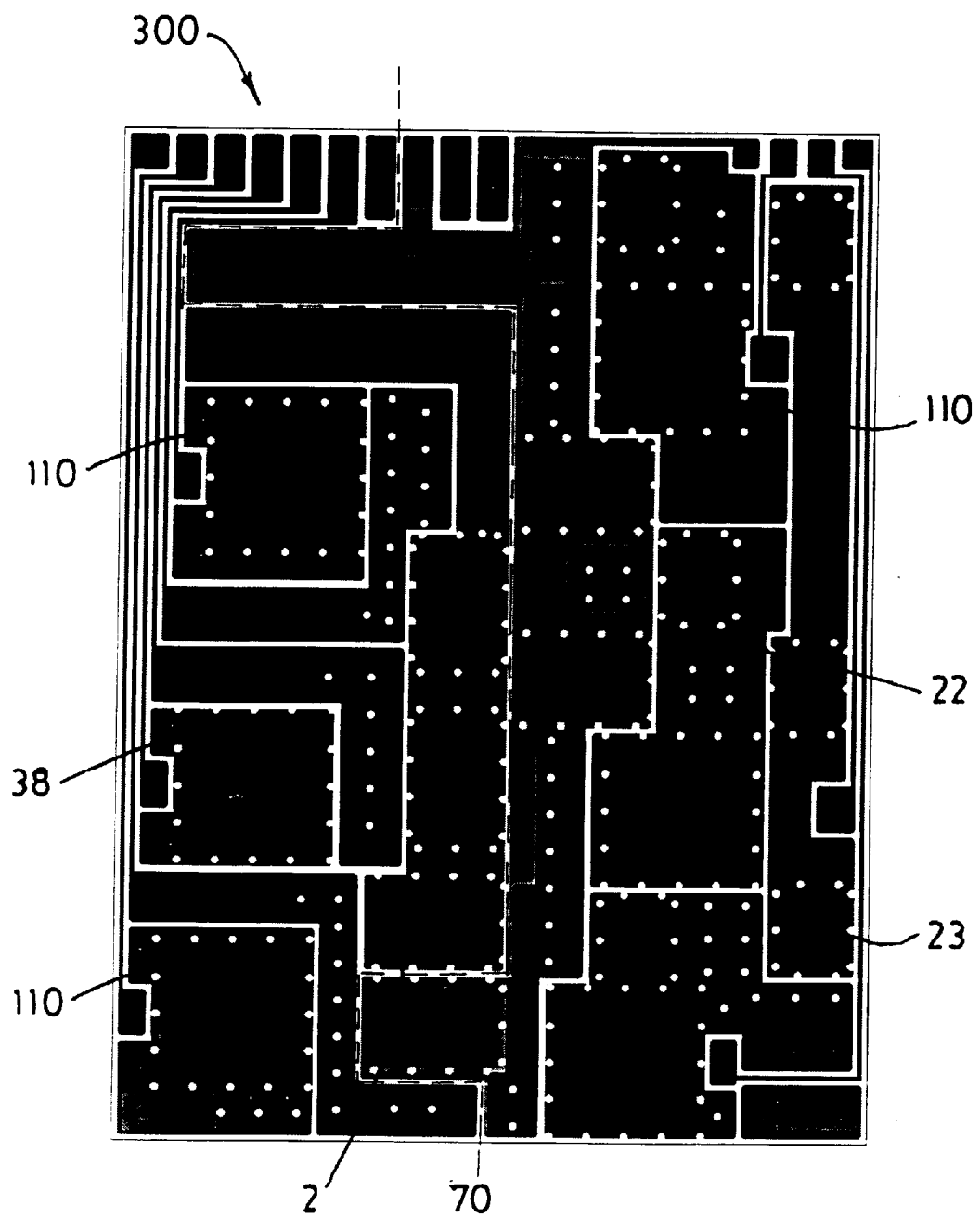
FIG. 13 is a top view of another preferred power board of this invention.

FIG. 13 is a top view of a preferred power board 300 used in this embodiment. The embodiment depicted in FIG. 13 is similar to the embodiment depicted in FIG. 3 (and described elsewhere in this specification) with the exception that its layout is somewhat different.

Figure 14:
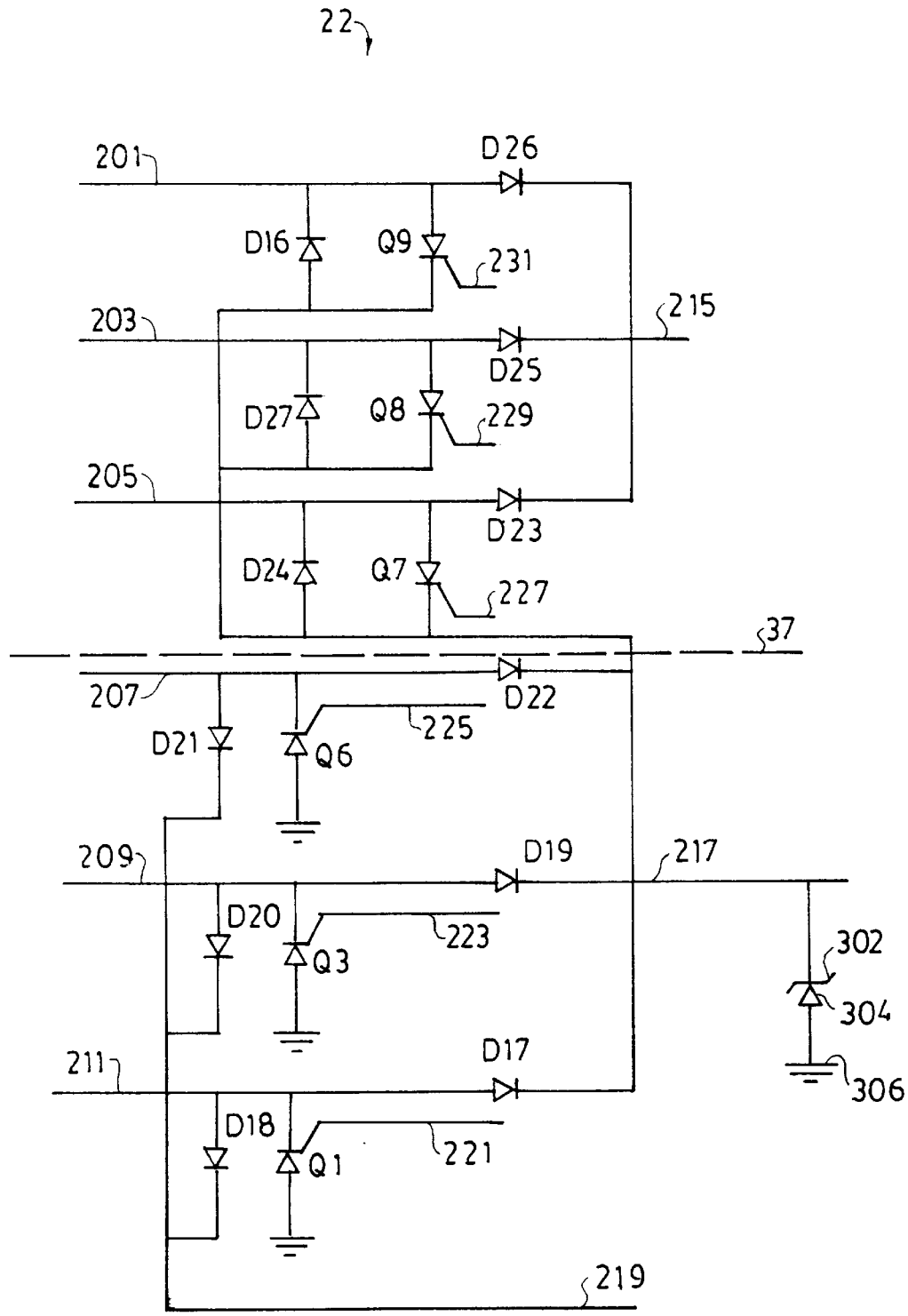
FIG. 14 is a schematic diagram of the preferred power board of FIG. 13.

FIG. 14 is a schematic diagram of the preferred power board of FIG. 13 which is very similar to the power board depicted in FIG. 4 and described elsewhere in the specification. It differs from the embodiment of FIG. 4 in that it contains a circuit protection unit 302 comprised of a zener diode 304 connected to ground 306. As will be apparent to those skilled in the art, any reverse voltage spikes that might damage the circuitry are passed to ground 306.

Figure 15:
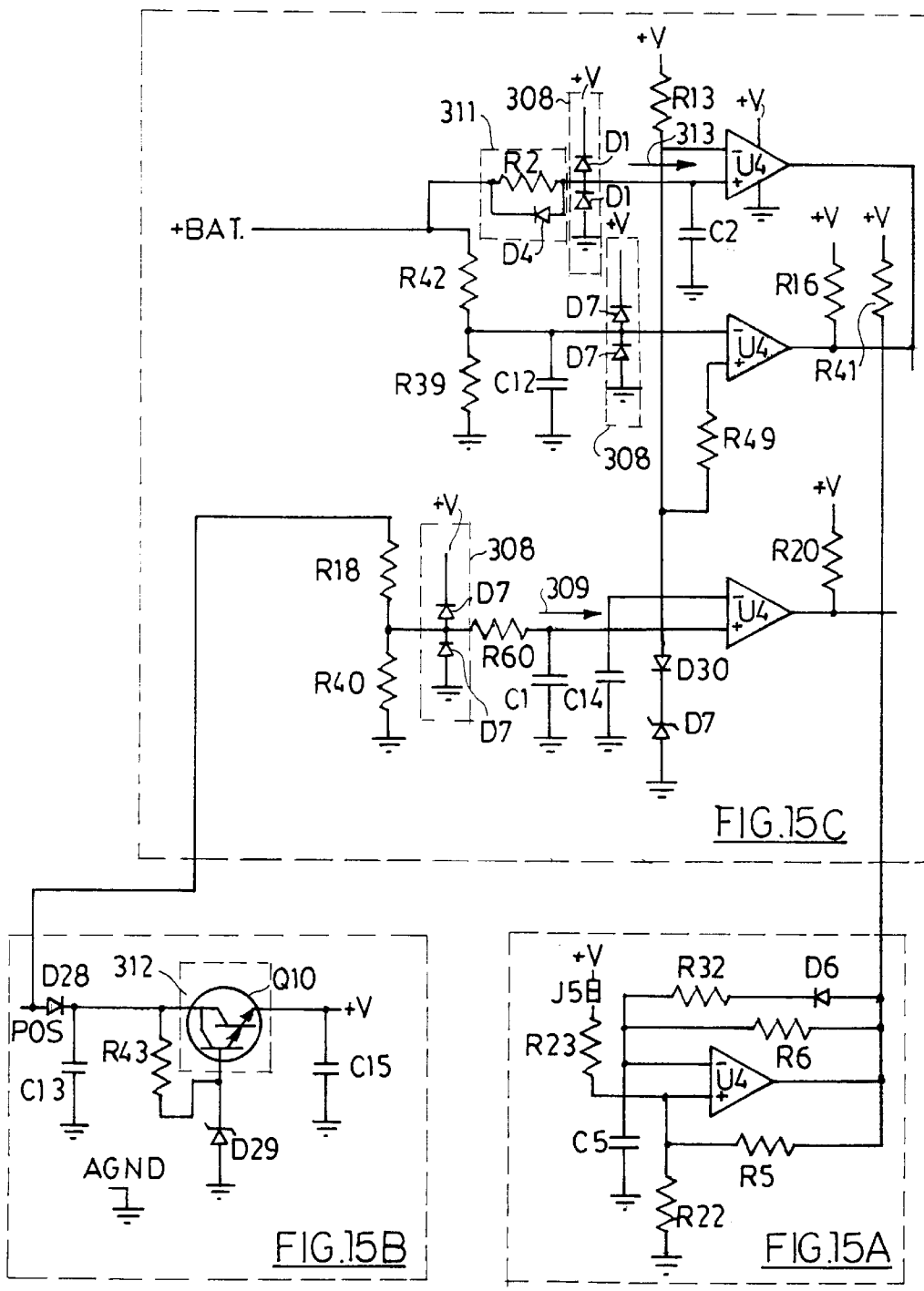
FIG. 15 is a schematic diagram of a preferred controller of the power supply of FIG. 13.

FIG. 15 is a schematic diagram of a preferred controller of the power supply of FIG. 13. As will be apparent to those skilled in this art, this controller differs from the controller depicted in FIG. 5 in that it has a different signal conditioning unit 308 and a different transistor driver 310.

Referring to FIG. 15, it will be seen that, in the preferred embodiment depicted, signal conditioning unit 308 is comprised of double diode D1 which, as will be apparent to those skilled in the art, eliminates voltage spikes in the direction of arrow 309. This voltage spike filter prevents noise triggering of the U4 operational amplifiers.

Referring again to FIG. 15, and in the preferred embodiment depicted therein, noise suppressor 311 also is utilized to control voltage spikes flowing in the direction of arrow 313.

FIG. 15A is the power supply of the controller of FIG. 15. This power supply is identical to the power supply depicted in FIG. 5A.

FIG. 15B is the clock of the controller of FIG. 15. This clock is similar to the clock depicted in FIG. 5, with the exception that it contains an added higher current Darlington transistor 312.

FIG. 15C is the voltage control circuitry of the controller of FIG. 15. The voltage control circuitry is similar to the voltage control circuitry depicted in FIG. 15 with the exception that it contains added signal conditioning components 308, and that it does not voltage dividers R48, R49, and R47.

Figure 16:
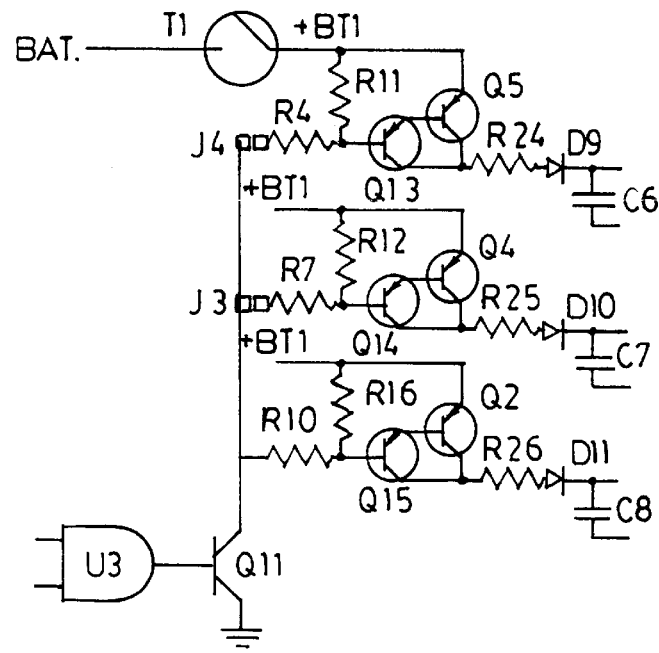
FIG. 16 is a schematic of the driver circuitry of the controller of FIG. 15.
Figure 16:
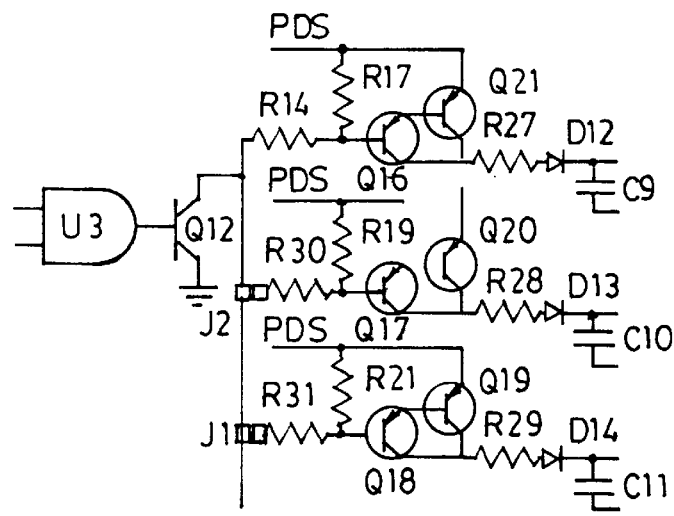
Figure 16:
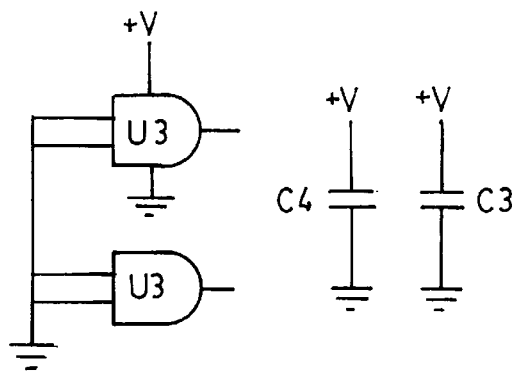

FIG. 16 is a schematic of the driver circuitry of the controller of FIG. 15.

Figure 17:
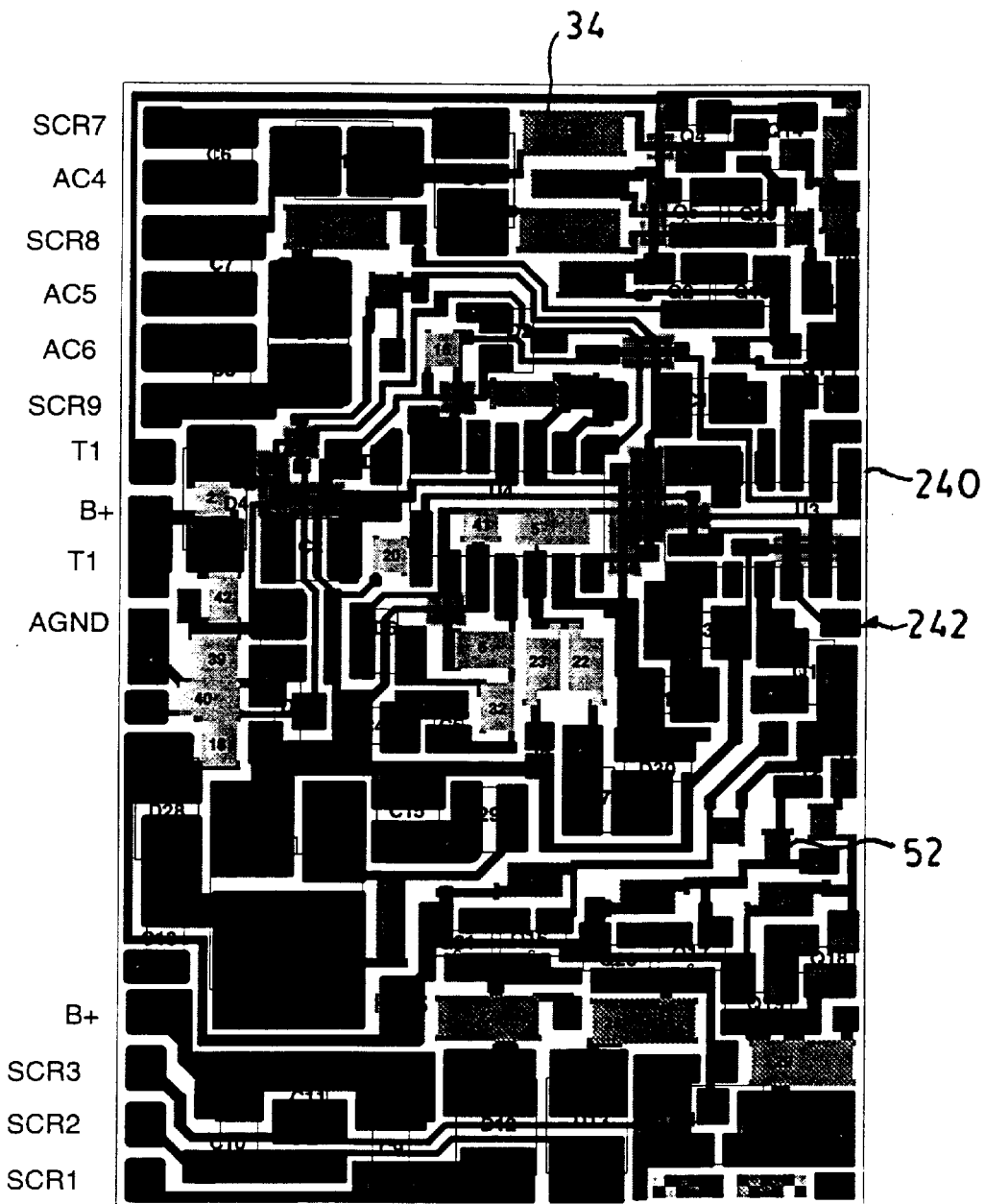
FIG. 17 is a top view of another preferred controller board of this invention.

FIG. 17 is top view of another preferred controller board of this invention which is similar to the controller board of FIG. 6 but differs in its layout of components.

Figure 18:
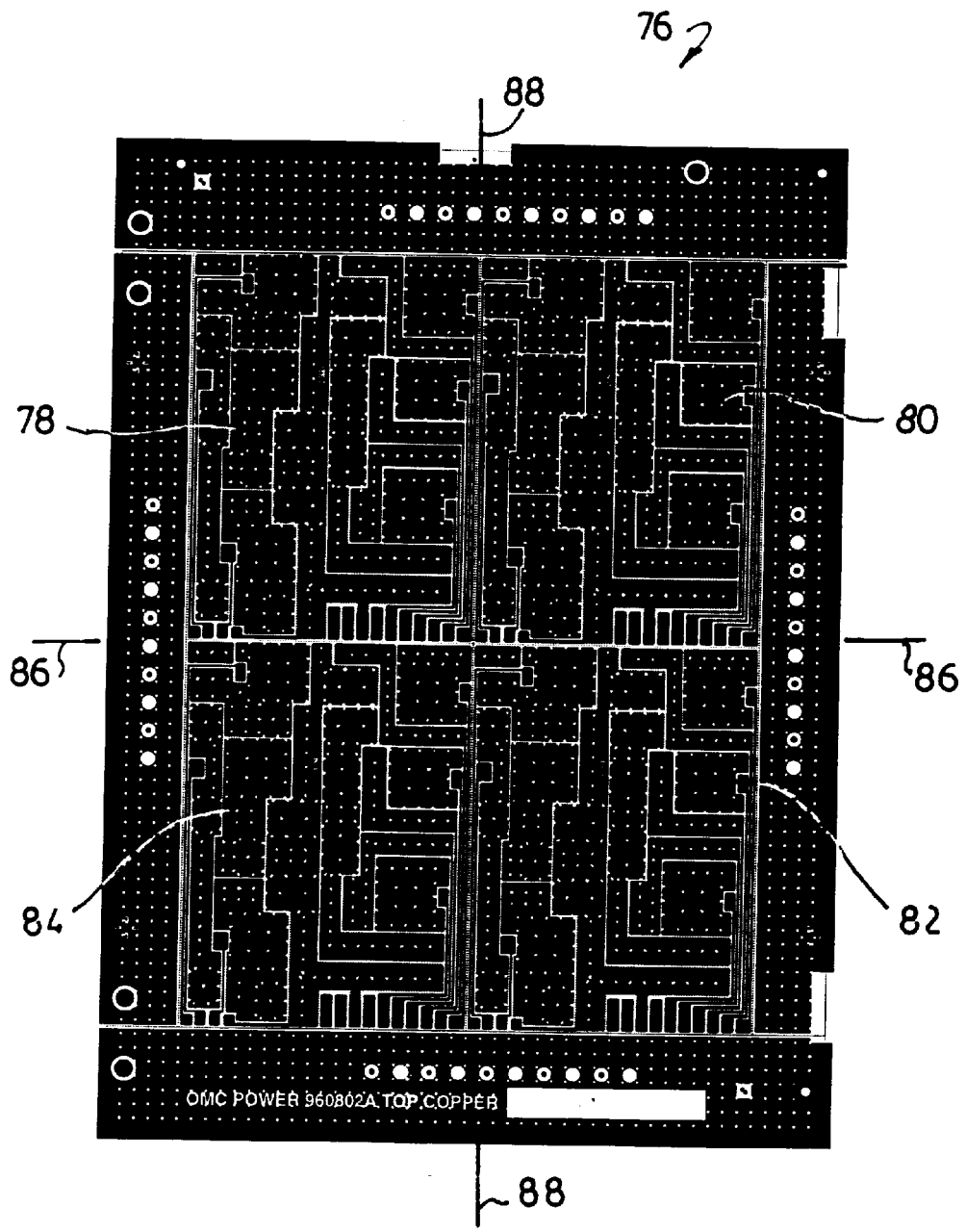
FIG. 18 is a top view of a preferred panel containing four power boards of this invention.

FIG. 18 is a top view of a preferred panel containing four power boards of this invention. The panel depicted in FIG. 18 is similar the panel depicted in FIG. 7 but has a different physical layout of components.

Figure 19:
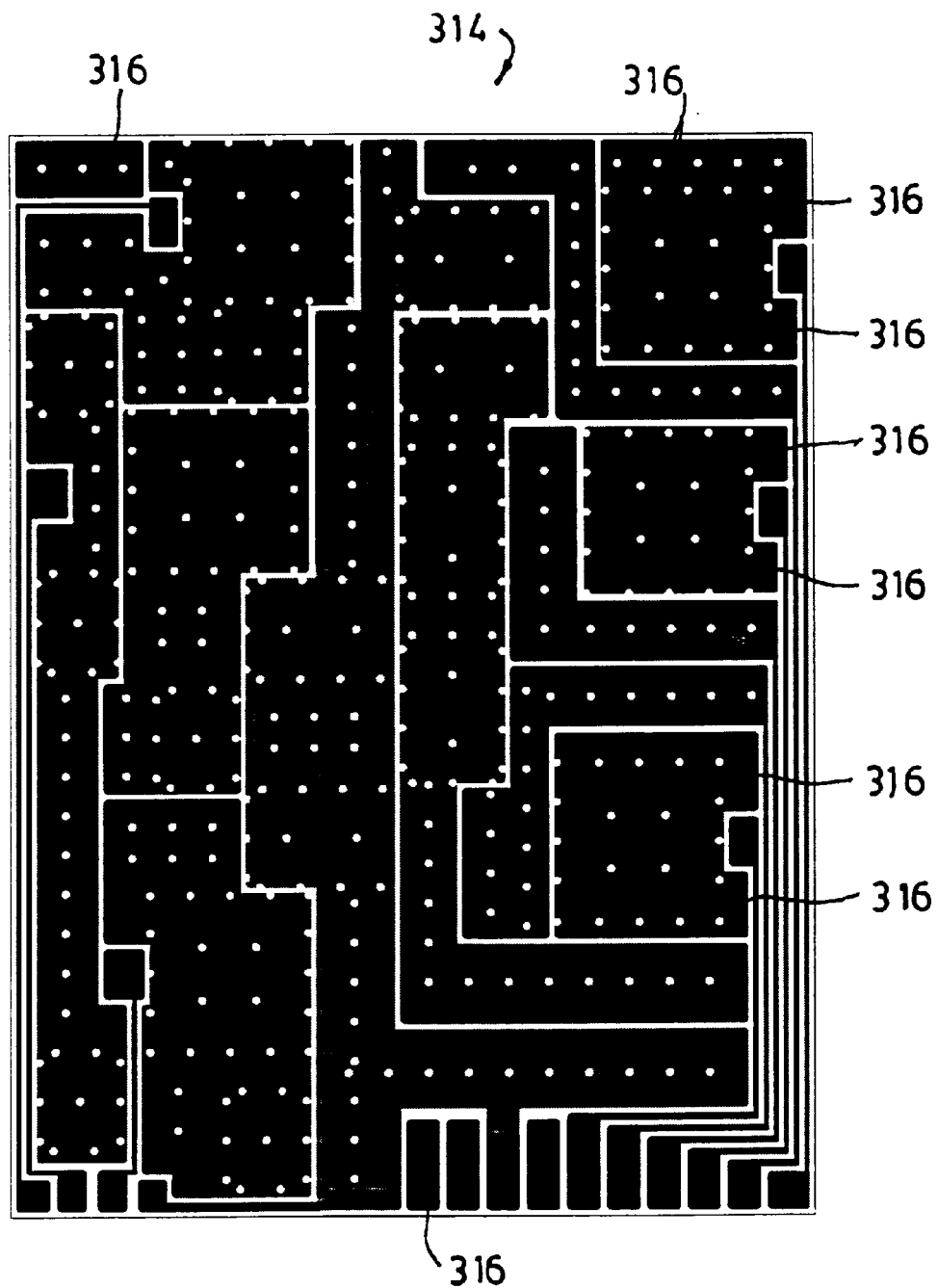
FIG. 19 is a top view of an individual power board made in accordance with this invention.

FIG. 19 is a top view of an individual power board made in accordance with this invention which has a different physical layout of circuits and location of through holes. Referring to FIG. 19, it will be seen that power board 314 is comprised of a multiplicity of completely filled vias 316. In one embodiment, completely filled vias 316 has no visible voids at a magnification of 200×. In another embodiment, completely filled vias 316 have no visible voids at a magnification of 1000×.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

We claim:

1. A miniature power supply and voltage regulator comprised of a ceramic substrate comprising a top surface and bottom surface, a first layer of conductive metal bonded to said top surface, and a second layer of conductive metal bonded to said bottom surface, wherein said power supply and voltage regulator is comprised of a first means for converting alternating current to direct current, a second means for converting alternating current to direct current, a means for determining the current demands of a load, and a means for delivering said current demands to said load, wherein:

(a) said power supply and voltage regulator has a power handling capacity of at least 23 watts per square inch of surface area of said top surface, (b) a first heterogeneous juncture band exists between said first layer of conductive metal and said top surface, (c) a second heterogeneous juncture band exists between said second layer of conductive metal and said bottom surface, (d) each of said first heterogeneous juncture band and said second heterogeneous juncture band has a metal-wetted surface area that is at least about twice the apparent surface area of the copper overlying the juncture band and consists essentially of ceramic grains unitary with said ceramic substrate and conductive metal unitary with said copper layer and being constituted by finger-like copper protuberances unitary with the copper layer and occupying the spaces between the ceramic grains of said ceramic, (e) said ceramic substrate has a thickness of at least about 10 mils, (f) each of said first layer of conductive metal and said second layer of copper has a thickness of at least about 3.5 mils and is comprised of at least about 98 weight percent of conductive metal, (g) the thickness of each of said first layer of conductive metal and said second layer of conductive metal is at least 0.3 times as great as the thickness of said ceramic substrate, (h) said power supply and voltage regulator is comprised of a noise suppressor circuit, (i) said power supply and voltage regulator is comprised of at least six silicon controlled rectifiers, (j) said power supply and voltage regulator is comprised of a multiplicity of diodes, and (k) said silicon controlled rectifiers and said diodes are surface mountable components in bare die form.

2. The power supply as recited in claim 1, wherein said ceramic is beryllia.

3. The power supply as recited in claim 1, wherein said ceramic is alumina.

4. The power supply as recited in claim 3, wherein said conductive metal is copper.

5. The power supply as recited in claim 4, wherein said alumina substrate has a thickness of from about 20 to about 30 mils.

6. The power supply as recited in claim 5, wherein each of said first layer of copper and said second layer of copper has a thickness of at least about 6 mils.

7. The power supply as recited in claim 6, wherein said alumina substrate is comprised of a multiplicity of through holes extending from said top surface of said substrate to said bottom surface of said substrate.

8. The power supply as recited in claim 7, wherein each of said through holes is completely filled so that, at a magnification of 200 diameters, no visible voids appear.

9. The power supply as recited in claim 7, wherein at least about 100 vent holes per square inch are disposed within said top layer of copper and said bottom layer of copper.

10. The power supply as recited in claim 9, wherein each of said vent holes has a diameter of from about 5 mils to about 25 mils.

11. The power supply as recited in claim 10, wherein each of said vent holes has a diameter of form about 18 mils to about 22 mils.

12. The power supply as recited in claim 10, wherein a first layer of dielectric material is disposed over and contiguous with said first layer of copper.

13. The power supply as recited in claim 12, wherein said first layer of dielectric material is comprised of a first material with a positive coefficient of thermal expansion and a second material with a negative coefficient of thermal expansion.

14. The power supply as recited in claim 13, wherein said first layer of dielectric material has a coefficient of thermal expansion which is substantially identical to the coefficient of thermal expansion of said first layer of copper.

\* \* \* \* \*